United States Patent [19]

Leo

[11] Patent Number: 5,427,124
[45] Date of Patent: Jun. 27, 1995

[54] PHOTOGRAPHIC PROCESSING APPARATUS

[75] Inventor: Vackier Leo, 's-Gravenwezel, Belgium

[73] Assignee: Agfa-Gevaert N.V., Mortsel, Belgium

[21] Appl. No.: 73,413

[22] Filed: Jun. 9, 1993

[30] Foreign Application Priority Data

Jul. 14, 1992 [EP] European Pat. Off. ............ 92202154

[51] Int. Cl.⁶ ............................................. B08B 11/00
[52] U.S. Cl. ............................. 134/64 P; 134/122 P; 100/160; 68/22 R
[58] Field of Search ............ 134/122 R, 122 P, 64 R, 134/64 P, 104.1; 68/264, 269 B, 126, 22 R, 97, 99, 46, 47, 100, 101, 102, 103, 104, 105, 106, 107, 109, 110, 125, 126, 98; 100/158 R, 160, 175, 164, 155 R, 168, 169; 355/217, 307; 226/174; 118/114, 116, 117; 101/132, 216; 156/582; 162/314, 373, 376

[56] References Cited

U.S. PATENT DOCUMENTS

| | | | |
|---|---|---|---|
| 72,647 | 12/1867 | Lee, Jr. | 68/22 R |
| 146,209 | 1/1874 | Smith | 68/99 |
| 244,854 | 7/1881 | Church | 68/22 R |
| 293,789 | 2/1884 | Sargent et al. | 68/22 R |
| 2,656,582 | 10/1953 | Freilander | 68/22 R |
| 3,064,458 | 11/1962 | Grimes | 68/22 R |
| 3,566,781 | 3/1971 | Kunze | 100/160 X |
| 3,703,156 | 11/1972 | Niesen et al. | 118/117 |
| 3,810,776 | 5/1974 | Banks et al. | 118/114 X |
| 4,192,229 | 3/1980 | Tsunoi et al. | 100/160 X |
| 4,213,420 | 7/1980 | Martino | 118/114 X |
| 4,235,166 | 11/1980 | Tsunoi | 100/160 X |
| 4,439,035 | 3/1984 | Landa | 355/307 |
| 4,798,134 | 1/1989 | Beery et al. | 100/160 X |

FOREIGN PATENT DOCUMENTS 994239 6/1965 United Kingdom ................ 100/160

Primary Examiner—Frankie L. Stinson
Attorney, Agent, or Firm—William J. Daniel

[57] ABSTRACT

Apparatus for processing photographic sheet material includes a pair of rotatable squeeze rollers mounted one above the other to define a nip through which the sheet material passes, and a pressure roller resting on the upper roller periphery generally opposite the lower roller for biasing the upper roller against the lower roller solely by the force of gravity on the pressure roller. Thus, the biasing force on the squeeze rollers is uniform along their length. Preferably, a plane passing through the axes of rotation of the two squeeze rollers is tilted slightly forward in the feed direction of the sheet material from a vertical plane passing through the lower roller axis and the axis of the pressure roller is situated between the two planes. The pressure rollers each have a radially outward layer of elastomeric material thereon.

10 Claims, 2 Drawing Sheets

PHOTOGRAPHIC PROCESSING APPARATUS

DESCRIPTION

1. Field of the Invention

This invention relates to apparatus for the processing of photographic sheet materials and particularly for developing lithographic offset printing plates.

2. Background of the Invention

In an apparatus or system for the development of aluminium lithographic printing plates of the type disclosed in EP 410500 it is advantageous to maintain the strength of the processing liquids within specified limits so as to maintain high quality printing plates, and reduce waste products.

During processing the photographic sheet material it is an advantage if the carry-over from one chemical bath to another chemical bath is kept to a minimum. It is therefore known to use pairs of squeeze rollers at the exit of a chemical bath to remove excess chemicals from the sheet material as it exits the bath.

A good removal of processing liquid also helps to speed up drying of the sheet material after the last processing bath.

In order to obtain good imaging quality it is necessary for the rollers to exert a load of 0.5–4.0 N/cm roller length to remove the excess materials. It is known to load the squeeze rollers together by using springs which act on the ends of the roller shaft or by the use of screw adjusters.

However, such systems have disadvantages in that they are difficult to dismantle to facilitate removal of the rollers for cleaning, or in the event of a jam in the system.

Also the roller pressure is not equal along the length of the rollers because the centre portion of the rollers tends to bow. This can be overcome by using parabolically contoured rollers but such rollers are expensive and also cause shear forces on the surfaces of the photographic material.

Further the use of screw adjusters makes the roller pressure difficult to regulate.

3. Object of Invention

The present invention seeks to provide a simple solution for loading squeeze rollers in order to remove excess liquid from processed photographic sheet material.

4. Statement of Invention

Accordingly there is provided an apparatus for processing photographic sheet material including a pair of squeeze rollers arranged one above the other and which are loaded against each other, characterised in that the upper squeeze roller is biased against the lower squeeze roller by the weight of at least one pressure roller arranged above the upper squeeze roller.

Preferably the apparatus is for the processing of exposed aluminium lithographic offset printing plates.

The pressure roller is preferably an idle roller which is driven by contact with the upper squeeze roller, and is preferably formed from stainless steel.

Conveniently the rollers have rotation shafts at the end portions of which are located end bearings, preferably nylon bearings, and the end bearings of the three shafts are housed in slots having open upper ends to facilitate removal of the rollers.

Such an apparatus is extremely simple, is easy to dismantle for cleaning or clearing of jams, gives equal pressure along the length of the roller, and has virtually no maintenance problems.

The apparatus may include a water sprayer to facilitate cleaning of the apparatus.

BRIEF DESCRIPTION OF DRAWINGS

The invention will be described by way of example and with reference to the accompanying drawings in which.

DETAILED DESCRIPTION OF THE INVENTION

Figure 1:
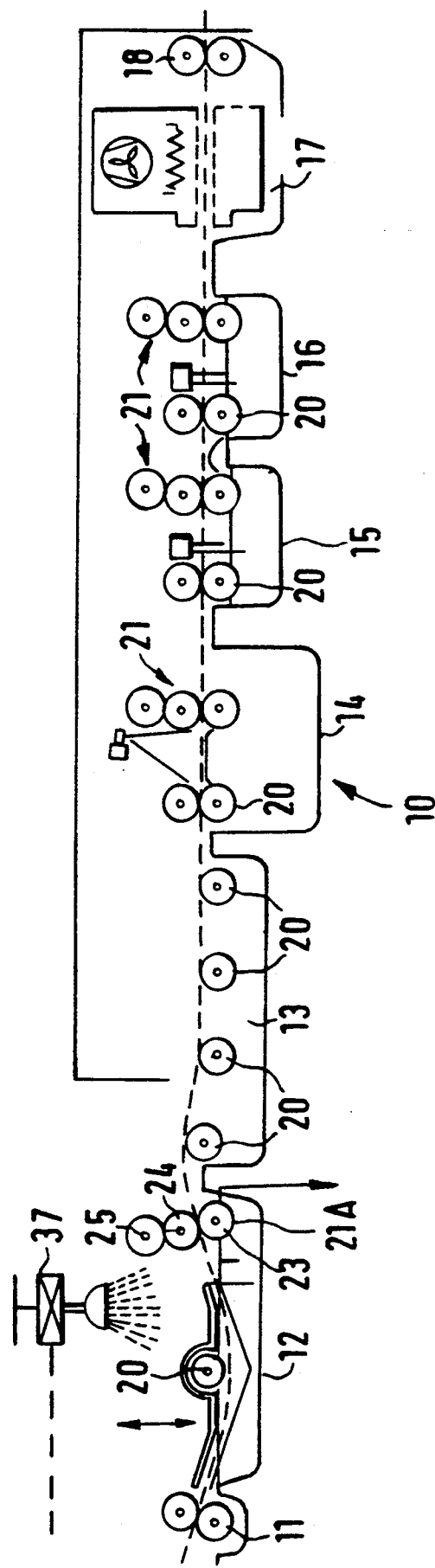
FIG. 1 is a schematic layout of processing apparatus according to the invention.

With reference to FIG. 1 there is illustrated a longitudinal cross-section through an apparatus 10 for processing exposed photographic sheet material, in particular aluminium lithographic printing plates, of the type described in EP-A-410500.

EP-A-410500 discloses an imaging element containing an aluminium support provided with, in the order given, an image receiving layer and a silver halide emulsion. In the document there is disclosed a diffusion transfer reversal process (hereinafter called DTR-process) for obtaining a lithographic printing plate in which said imaging element is image-wise exposed and subsequently developed using a developing liquid or activating liquid in the presence of a silver halide complexing agent. The imaging element is then guided through a diffusion transfer zone so that the silver halide complexes formed during the development step are allowed to diffuse into the image-receiving layer where they are converted to silver. When the imaging element leaves the diffusion transfer zone a silver image is formed in the image receiving layer. The now useless photosensitive layer and optional other layers above the image receiving layer are then removed by rinsing the imaging element in a washing section. Finally the element now carrying a silver image on its surface is treated with a finishing liquid that contains so called hydrophobizing agent for improving the hydrophobicity of the silver image.

In the above described method for obtaining an aluminium based lithographic printing plate accoring to the DTR-process generally three different liquids are used i.e. a developing or activating liquid, a rinsing liquid and a finishing liquid.

The apparatus 10 is mounted within a generally rectangular housing which may include a rectangular metal frame (not shown) for supporting the various parts of the apparatus.

The apparatus comprises a sheet feed means 11, preferably a pair of rollers, a developing section 12, a diffusion transfer section 13, a wash section 14, a rinse section 15, a finishing section 16, a drier 17, and output rollers 18. All these sections include conveyor rollers 20 and the exit ends of at least the developing section 12 and the finishing section 16 have sets of squeeze rollers 21 to remove excess liquid from the sheet material as it exits the respective section. Sets of squeeze roller 21 may also be used in the wash and rinse sections.

All the rollers 11, 20, 21, 18 and squeeze rollers are linked by a single drive shaft 26 (see FIG. 2) to operate simultaneously to advance sheet material through the apparatus 10 from the feed means 11 to the output rollers 18.

Figure 2:
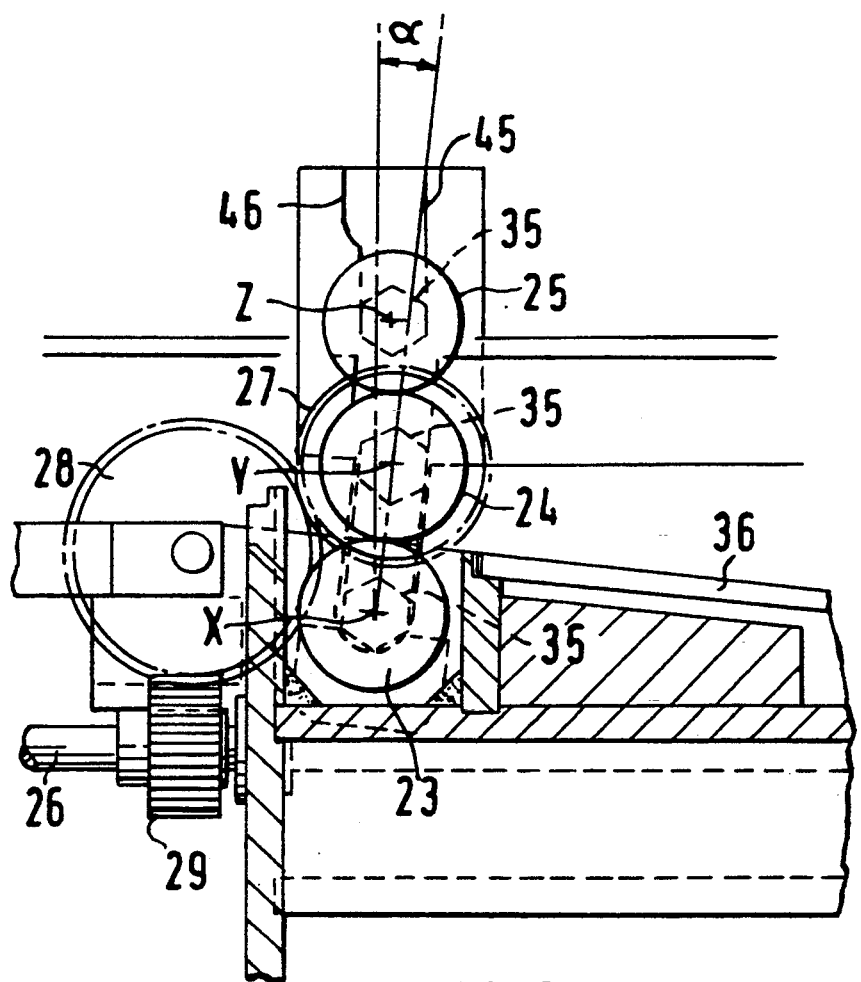
FIG. 2 is a detailed side view of the squeeze rollers used on the apparatus.
Figure 3:
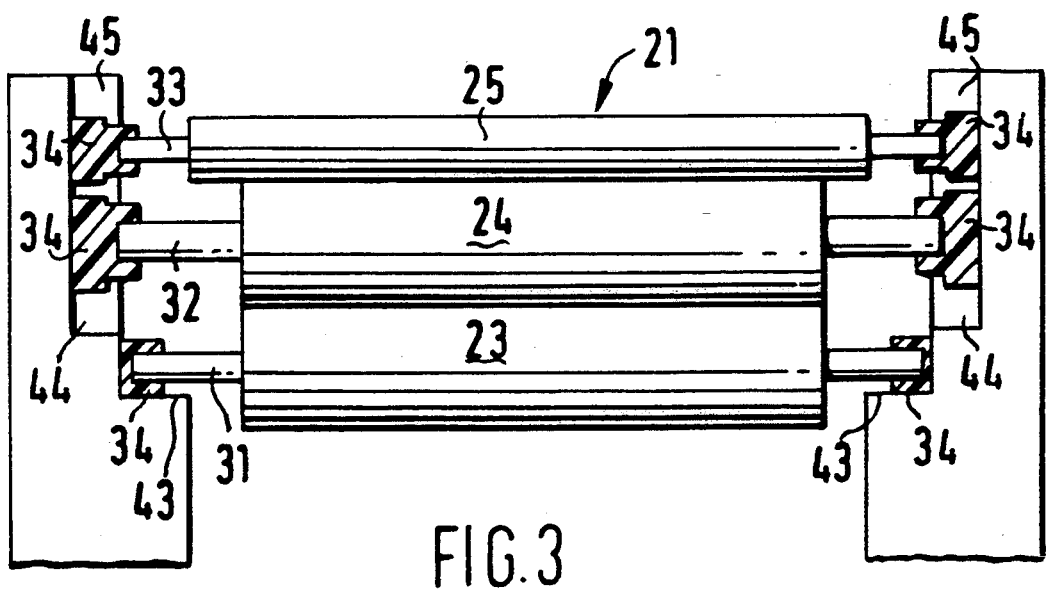
FIG. 3 is a front view of the squeeze rollers showing the roller shaft end bearings.

The squeeze rollers 21 at the ends of the sections are best seen in FIG. 2 and FIG. 3, since each set of squeeze rollers 21 is identical only one set of rollers will be described.

Each set of squeeze rollers 21 comprises a lower squeeze roller 23, and upper squeeze roller 24, and pressure roller 25.

The upper squeeze roller 24 is driven through gears 27, 28, 29 by the drive shaft 26 for operation of the set of squeeze rollers 21.

The upper and lower squeeze rollers both have at least their radially outer surfaces formed from an elastomeric material preferably polyurethane elastomer having a shore—hardness of about 35, and the presssure roller 25 is formed from stainless steel. The three rollers 23, 24, 25, have rotation shafts 31, 32, 33 respectively, the end portions of which are located within end bearings 34.

The end bearings 34 are formed from a suitable polymer material such as nylon or acetal resin and each have a hexagonal end cap 35 to allow them to slide within a retaining groove or slot 43 whilst preventing the rotation of the bearings 34 in the slots 43. The lower squeeze roller 23 is held by the end bearings 34 on its shaft 31 in a pair of opposed slots 43 with an open upper end to allow easy removal of the lower squeeze roller.

The upper squeeze roller 24 is held by the end bearings 34 on its shaft 32 in a second pair of opposed slots 44 which hold the upper squeeze roller 24 firmly in alignment with the lower roller 23 but allows the upper roller 24 to move radially relative towards and away from the lower squeeze roller. The axes of rotation X, Y of the two squeeze rollers 23 and 24, respectively, are off-set by an angle of 6 degrees from a vertical from a vertical plane passing through the axis of the lower roller towards the feed i.e. output, side of the rollers so that the rollers 23, 24 are arranged in a line normal to an inclined feed surface 36, and the opposed slots 44 are inclined to achieve this end with the upper end of the slots 44 being open to facilitate the removal of the upper squeeze roller 24.

The pressure roller 25 is held by end bearings 34 on its shaft 33 in a third set of opposed grooves or slots 45 which, may if desired run into the respective second slots 44, and which has an open upper end 46 to allow removal of the roller 25.

The axis of rotation Z of the pressure roller 25 is arranged in the grooves 45 vertically above the upper squeeze roller 24, so that it is free to slide within the grooves 45 so that its weight is exerted along the entire length of the upper squeeze roller 24 biasing it against the lower squeeze roller 23. The weight of the pressure roller 25 is preferably between 5–15 kgs, preferably 5–10 kgs, so that it can be easily removed from its retaining slots 45. If it is desired to increase the load on the squeeze rollers 23, 24, then provision can be made for a second pressure roller (not shown) to act vertically on the first pressure roller 25. The pressure roller 25 is an idle roller driven by contact with the upper roller 24.

Arranged above the apparatus 10, preferably above the squeeze rollers 23, 24, there is a hand operated water sprayer 37 which can be used for cleaning the apparatus 10 at periodic intervals after two–three weeks continual use. The developing section squeeze rollers 21a in particular may become contaminated with gelatine from the photographic material during that time. The in-built water sprayer has the advantage that no major parts have to be removed from the apparatus for cleaning and that the rollers may be cleaned in situ and are therefore less likely to be touched by hand and become contaminated with foreign bodies. The contaminated water from the apparatus is then fed into the same recovery system as is used for the working liquids form the different sections, 12, 14, 15, 16.

The invention is not limited to the described embodiment. The slots 43, 44, 45 could be formed as a single slot instead of being discrete slots with the end bearings being slid into the slot one after the other. The end bearing caps could be any suitable shape to prevent rotation in the slots. The squeeze roller could be covered in EPDM (ethylene propylene diene monomer) or other elastomeric material.

Alternatively, only the squeeze roller in contact with the front (picture) side of the sheet is elastomer coated, the reverse side roller being hard.

I claim:

1. Apparatus for processing photographic sheet material in which said sheet material is advanced along a generally fixed path through a bath of processing liquid and then to a pair of squeeze rollers disposed above said path and out of contact with said bath of liquid, the rollers of said pair being mounted for rotation one above the other to define a nip through which said sheet material passes to remove liquid from said sheet material, at least one of said rollers having thereon a radially outward layer of elastomeric material, and means for biasing said squeeze rollers together, wherein the biasing means comprises at least one rotatable pressure roller resting on the upper squeeze roller generally opposite said lower squeeze roller and biased against said upper squeeze roller only by the force of gravity on the mass of said pressure roller, said at least one pressure roller having a length at least equal to the length of the upper squeeze roller.

2. Apparatus as claimed in claim 1, wherein the pressure roller is an idler roller, which is rotated by contact with the upper squeeze roller.

3. Apparatus as claimed in claim 1, wherein said squeeze and pressure rollers have rotation shafts and the rotation shafts of all three rollers have their end portions journaled in separate end bearings, the end bearings of the three shafts being slideably fitted in slots having open upper ends to facilitate removal of the rollers.

4. Apparatus as claimed in claim 1 which further comprises a guide surface upstream of the nip of said squeeze rollers for delivering said sheet material to said nil said guide surface being inclined upwardly in the nip direction and wherein the axes of rotation of said squeeze rollers are each linear and a plane passing through said axes is inclined from the vertical upwardly and backwardly relative to the feed direction of a sheet through said nip by a small angle such that said plane is generally perpendicular to said guide surface.

5. Apparatus as claimed in claim 4, wherein said small angle is about six degrees.

6. Apparatus as claimed in claim 1, said pressure roller is formed from stainless steel.

7. Apparatus as claimed in claim 1, wherein the weight of each such pressure roller is 5 to 15 kg.

8. Apparatus as claimed in claim 1, wherein which further comprises a water spray head disposed generally above said pressure roller for insitu cleaning of the apparatus.

9. Apparatus as claimed in claim 1, wherein said squeeze rollers have the same diameter.

10. Apparatus as claimed in claim 1 characterized in that the axes of rotation of said squeeze rollers are each linear and said pressure roller makes substantially tangential contact with the periphery of said upper roller at a locus spaced upstream a short arc from the intersection with the upper roller periphery of a plane passing through the axes of rotation of both squeeze rollers.

* * * * *